United States Patent [19]

Nawata

[11] Patent Number: 5,050,192
[45] Date of Patent: Sep. 17, 1991

[54] AUTOMATIC GAIN CONTROL

[75] Inventor: Hizuru Nawata, Tokyo, Japan

[73] Assignee: NEC Corporation, Tokyo, Japan

[21] Appl. No.: 616,956

[22] Filed: Nov. 21, 1990

[30] Foreign Application Priority Data

Nov. 21, 1989 [JP] Japan ............................. 1-300889

[51] Int. Cl.$^5$ ............................................. H04L 27/08
[52] U.S. Cl. ..................................... 375/98; 455/245; 455/249
[58] Field of Search ................... 375/76, 98; 358/174, 358/175; 330/254, 129; 455/245, 247, 249, 250; 370/93; 329/321

[56] References Cited

U.S. PATENT DOCUMENTS

| | | | |
|---|---|---|---|
| 3,958,213 | 5/1976 | Scott et al. | 375/98 |
| 4,546,326 | 10/1985 | Van Uffelen et al. | 330/129 |
| 4,625,240 | 11/1986 | Yablonski et al. | 375/98 |
| 4,829,593 | 5/1989 | Hara | 455/234 |
| 4,852,126 | 7/1989 | Tanaka et al. | 375/98 |
| 4,864,244 | 9/1989 | Sasaki | 375/98 |
| 4,989,074 | 1/1991 | Matsumoto | 455/234 |

OTHER PUBLICATIONS

P. Bylanski and D. G. W. Ingram, "Digital Transmission Systems", published by Peter Peregrinus Ltd., reprinted 1987, pp. 381-385.

Primary Examiner—Stephen Chin
Attorney, Agent, or Firm—Sughrue, Mion, Zinn, Macpeak & Seas

[57] ABSTRACT

An automatic gain control (AGC) for a demodulator which receives digitally modulated burst signals time-serially from a plurality of terminals. The AGC has a series connection of a variable attenuator and a limiter that precedes a demodulator. The variable attenuator is controlled such that when a burst signal is absent, the noise power level inputted to the limiter coincides with a predetermined reference value, whereby when burst signal is present, the limiter controls the burst signal to a predetermined level. As a result, when burst signals greatly differ in level from one another, they are controlled to the predetermined level in their preamble word portions. This insures stable demodulation of data signals.

9 Claims, 5 Drawing Sheets

AUTOMATIC GAIN CONTROL

BACKGROUND OF THE INVENTION

The present invention relates to an automatic gain control (AGC) and, more particularly, to an AGC for a demodulator which receives digitally modulated burst signals from a plurality of stations.

The time division multiple access (TDMA), PURE ALOHA and SLOTTED ALOHA communication systems, for example, belong to a family of multiple access satellite communication systems which set up communications between a single central earth station and a plurality of remote earth station via a satellite over a common channel. In such a multiple access satellite communication system, the central earth station receives digitally modulated burst signals lying in the radio frequency band time-serially from the remote earth stations over a common channel. The burst signals lying in the radio frequency band are converted into intermediate frequency modulated waves. To allow a demodulator to demodulate the modulated waves, it is necessary that the reception power of the burst signals from the remote earth stations be constant. Two different methods are available for meeting the above requirement, i.e., a method that causes each remote earth station to control the transmission power of the burst signal to be transmitted and a method that causes the central earth station to automatically control the gain of each received burst signal.

The Very Small Aperture Terminal (VSAT) system or similar system which needs miniature and inexpensive remote earth stations is implemented only with the above-mentioned central earth station-oriented method.

An AGC for maintaining the reception power at the central earth station constant may be implemented as a closed loop of variable attenuator, demodulator, comparator, and low-pass filter, as described in pages 381-385 of a book entitled "Digital Transmission SYSTEMS" by P Bylanski and DGW Ingram and published by peter Peregrinus Ltd., reprinted 1987. The demodulator receives digitally modulated signals from the remote earth stations via the variable attenuator, and then demodulates them to produce demodulated signals. The comparator calculates the power levels from the demodulated signals, compares the results of calculation with a reference power, and then outputs signals representative of the differences. The low-pass filter removes noise from the outputs of the comparator. The variable attenuator adjusts the amounts of attenuation of the modulated waves in response to control signals which are the outputs of the low-pass filter.

In the closed loop type AGC system, when the reception power is changed, the response speed up to the time when desired output power is achieved is inversely proportional to the equivalent noise bandwidth of the closed loop. The problem with the satellite communication system is that the C/N ratio of the demodulator is so low that the equivalent noise bandwidth has to be reduced, resulting in low response speed.

Usually, bustt signals from remote earth stations each is headed by a preamble word which is a training bit sequence for recovering a carrier and a bit timing. To faithfully recover a data signal following the preamble word, the reception power should preferably be controlled in the preamble word portion.

However, the reception power sometimes greatly differs from one burst signal to another received by the central earth station due to the scattering among the transmission outputs of the individual remote earth stations, different weather conditions, etc. In this condition, when the remote earth stations send burst signals in a single frame on a time division basis, the reception power or level at the central earth station greatly differs from one burst signal to another. Hence, it is extremely difficult for the conventional AGC to maintain the reception power constant in the preamble word portion due to the slow response particular thereto. Should the power be not made constant in the preamble word portion, the central earth station would receive burst signals incorrectly or, if received them correctly, degrade the bit error rate (BER) in the data signal portion.

SUMMARY OF THE INVENTION

It is therefore an object of the present invention to provide an AGC which is capable of providing a power-controlled signal to a demodulator.

Another of the present invention is to provide an AGC which is suitable for a multiple access satellite communication system used with very small aperture terminals.

According to the invention, there is provided an AGC for a demodulator which receives digitally modulated burst signals time-serially from a plurality of stations, the system comprising a demodulator for demodulating digitally modulated waves from the plurality of stations to produce a demodulated signal, a unique-word detector for detecting candidates of unique words out of the demodulated signal to output unique-word candidate detection pulses, an aperture generator for generating apertures for detecting unique words, a gate for detecting true unique words on the basis of the unique-word candidates detection pulses and the apertures to produce unique-word detection pulses, a decision circuit for determining whether or not the burst signals exist on the basis of the unique-word detection pulses and apertures to produce a status decision signal, a circuit generating a gain control signal from a power value of the demodulated signal and a predetermined reference value, a control circuit responsive to the status decision signal for outputting the gain control signal as a control signal when the burst signals are absent and for outputting, when any burst signal is present, the gain control signal occurred at the time when a burst signal was absent immediately before that burst signal as the control signal, respectively, a variable attenuator in response to said control signal for providing an amount of attenuation of input waves and outputting an attenuated signal, and a limiter for limiting said attenuated signal and for producing a limited signal which is applied as the modulated waves to the demodulator.

The present invention serves to have the demodulator provide a demodulated signal which is free from reception errors and BER degradation which was a significant with the prior art.

BRIEF DESCRIPTION OF THE DRAWINGS

The above and other objects, features and advantages of the present invention will become more apparent from the following detailed description taken with the accompanying drawings in which.

DETAILED DESCRIPTION OF THE PREFERRED EMBODIMENT

Figure 1:
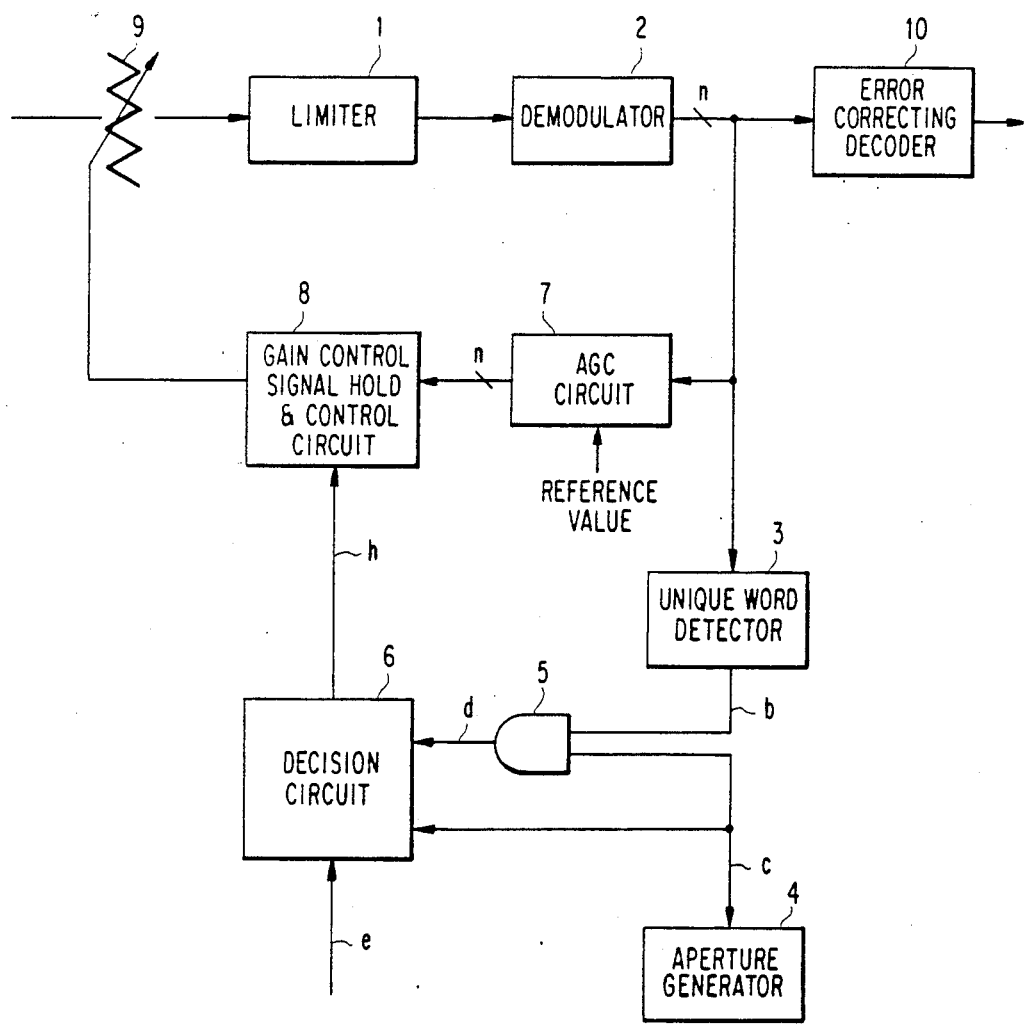
FIG. 1. is a block diagram schematically showing an AGC embodying the present invention.

Referring to FIG. 1 of the drawings, an AGC embodying the present invention is shown. The AGC is generally made up of a limiter 1, a demodulator 2, a unique word detector 3, an aperture generator 4, a gate 5, a decision circuit 6, an AGC circuit 7, a gain control signal hold & control circuit 8, and a variable attenuator 9.

Figure 2:
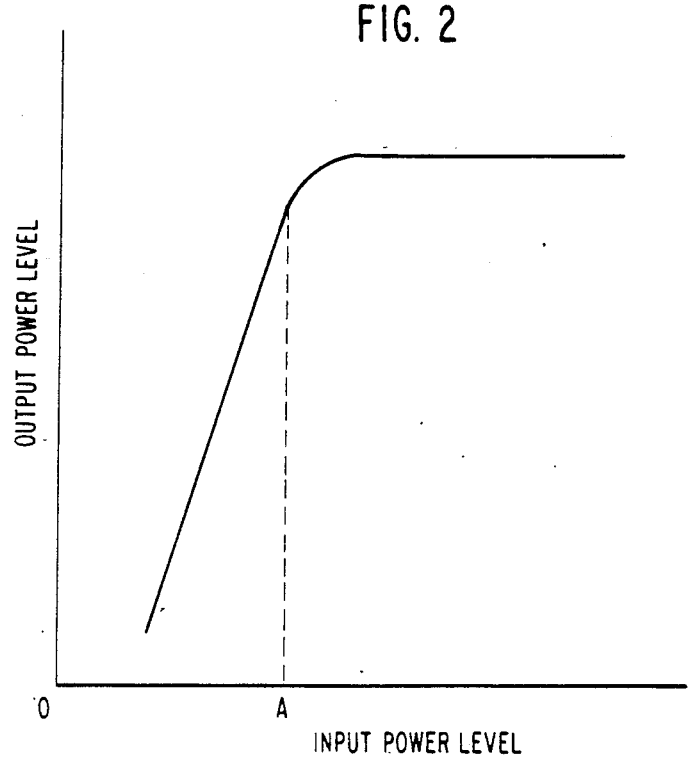
FIG. 2 is a graph indicating a specific characteristic of a limiter included in the embodiment.
Figure 3:
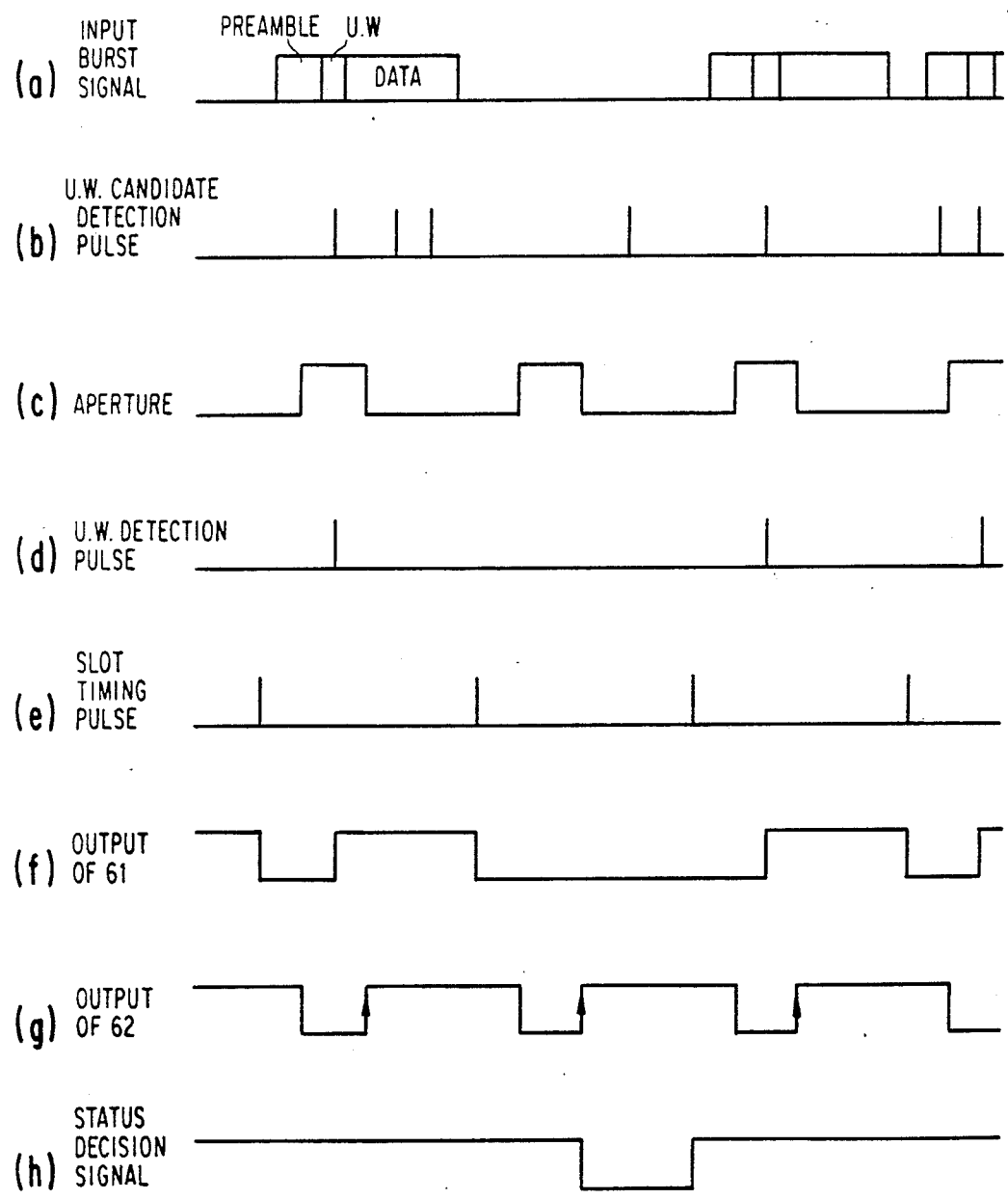
FIG. 3 is a timing chart showing output signals of various sections depicted in FIG. 1.

Digitally modulated burst signals (in FIG. 3(a)) from remote earth stations are applied to the limiter 1 via the variable attenuator 9. The limiter 1 controls the power of the individual burst signals to a predetermined value. The limiter 1 has a linear range and a saturation range, as shown in FIG. 2 specifically.

The demodulator 2 demodulates the burst signals having been controlled by the limiter 1 to a predetermined power level, thereby producing an n-bit digital demodulated signal.

The constant power level set up by the limiter 1 eliminates the delay of response particular to the conventional closed loop type AGC and thereby stabilizes the buildup of the leading edge of the burst signal.

The output signal of the demodulator 2 is also applied to the AGC circuit 7. In response, the AGC circuit 7 calculates the power level of the input signal, determines a difference between the calculated power level and a reference value which will be detailed soon, and then outputs the resulting error signal, i.e., a gain control signal after filtering it. The gain control signal of the AGC circuit 7 and the status decision signal (h) from the decision circuit 6 are fed to the gain control signal hold & control circuit 8.

The reference value $P_R$ for the AGC circuit is set as follows:

$$P_R = \frac{A}{1 + (C/N)_{worst}} \qquad (1)$$

wherein A is an input power to the limiter at a point A bordering the linear range and the saturation range as shown in FIG. 2, and $(C/N)_{worst}$ is a C/N (carrier power to noise power ratio) which is the worst of $(C/N)_s$ among received burst signals from remote earth stations. A is determined by the characteristic of the limiter and $(C/N)_{worst}$ is set design of the satellite communication system.

Equation (1) is derived from the requisite that the input power to the limiter at the worst $(C/N)_{worst}$ be set at the input power A of the critical point. Since the input power at the $(C/N)_{worst}$ is a sum of carrier power C and noise power N, the requisite leads the following:

$$C + N = A \qquad (2)$$

when equation (2) is rewritten in terms of the worst C/N, i.e. $(C/N)_{worst}$, $$N \cdot (C/N)_{worst} + N = A \qquad (3)$$

Replacement of N with $P_R$ and simple transformation in equation (3) gives equation (1).

Once the limiter input at the $(C/N)_{worst}$ among received burst signals from remote earth stations is set at the critical point of the limiter, the received burst signals from other remote earth stations goes beyond the critical point and the limiter produces a constant level which is coupled to the demodulator.

Thus, as explained later, the AGC control signal is generated employing the reference value expressed in equation (1) when a burst signal is absent while the AGC control signal in the "no burst" period immediately before the present "burst" period is used when the burst signal is present.

In a satellite communication system, most of the noise is usually thermal noise and noise power N is expected to be constant. However, the noise power changes with the gain variation of a low-noise amplifier and that of a frequency converter, each followed by the AGC control. The gain variations themselves do not affect (C/N) because the signal power changes similarly with the noise change, but the input power to the limiter at $(C/N)_{worst}$ is different from the value of the point A.

Therefore, the input noise power to the limiter must be controlled to be constant to set the input power to the limiter at $(C/N)_{worst}$ at the above-mentioned critical value. To achieve this, noise power to the limiter may be controlled to be constant when there is no burst signal.

The unique word detector 3 detects the candidates of unique words from the output signals of the demodulator 2 and produces a unique-word candidate detection signal (b). The aperture generator 4 generates apertures (c) for detecting unique words. The gate 5 is used to detect true unique words and, when the detection signal (b) exists while the aperture (c) is open, produces a unique word detection pulse (d). The unique word detection pulse (d) does not appear when the detection signal (b) does not exist while the aperture (c) is open. The decision circuit 6 outputs a status decision signal (h) in response to the aperture (c) and unique word detection pulse (d) as well as a slot timing signal (e) which is fed from the outside. The status decision signal (h) remains in a low level from the time when the aperture of the slot in which a unique word was not detected ends to the time when the next slot occurs. In the slots where unique words are detected, the status decision signal (h) goes high. A specific construction of the decision circuit 6 will be described in detail later.

The hold & control circuit 8 continuously delivers the gain control signal of the AGC circuit 7 to the variable attenuator 9 as a gain control signal as long as the status decision signal (h) is in a low level, i.e., from the time when the aperture of the slot where no unique words were detected to the time when the next slot occurs. When the status decision signal (h) is in a high level, i.e., in the slot where a unique word is detected, the gain control signal hold & control circuit 8 retains the gain of the variable attenuator 9 particular to the previous slot where a unique word was not detected, outputting the held value as a gain control signal. In response to the gain control signal fed from the gain control signal hold & control circuit 8, the variable attenuator 9 controls the amount of attenuation of the input signal. A specific construction of the gain control signal hold & control circuit 8 will be described in detail later.

As stated above, the illustrative embodiment performs the AGC operation in the slot where a unique word is not detected, i.e., where a burst signal does not exist from the end of the aperture to the beginning of the next slot, thereby maintaining the noise power constant. In the slot where a unique word is detected, i.e., in the slot where a burst signal exists, the illustrative embodiment holds the gain of the variable attenuator 9 occurred in the previous slot where a unique word was not detected and causes the limiter 1 to maintain the power level of burst signals constant.

Figure 4:
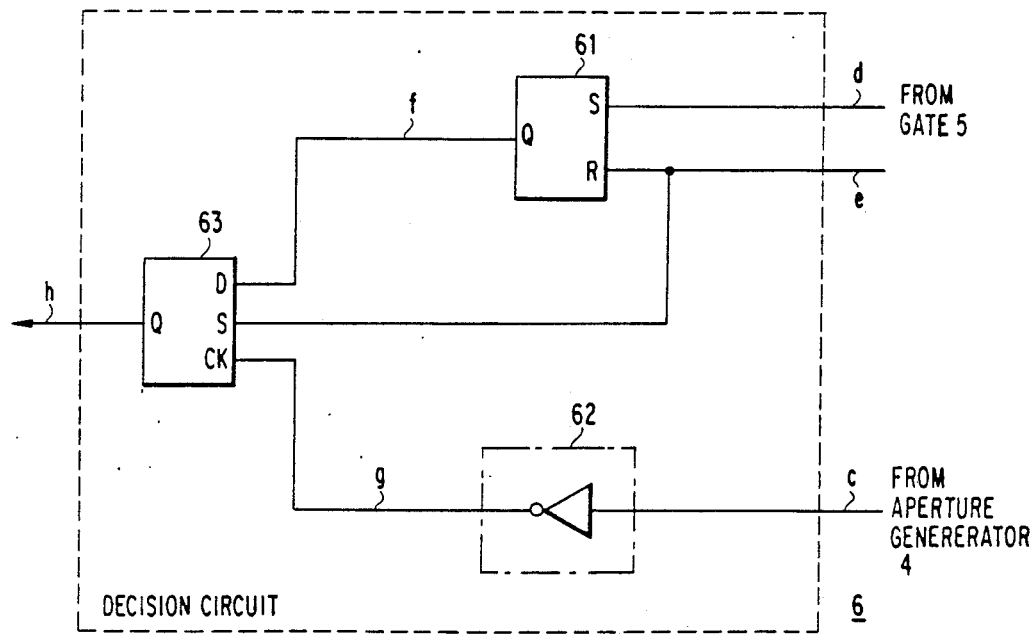
FIG. 4 is a block diagram schematically showing a specific construction of a decision circuit depicted in FIG. 1.

FIG. 4 shows a specific construction of the decision circuit 6. The decision circuit 6 has a set reset flip-flop (SR F/F) 61, an inverting circuit 62, and a D type flip-flop (D F/F) 63. The unique word detection pulses (d) and slot timing signal (e) are respectively applied to the set (S) terminal and reset (R) terminal of the SR F/F 61. In response, the SR F/F 61 produces a signal (f) on an output (Q) thereof. The slot timing signal (e) is generated by, for example, a slot timing generating circuit, not shown, and adjusted to the timing for a unique-word of receiving signals from remote earth stations. The output (f) of the SR F/F 61, the slot timing signal (e) and the inverted signal (g) of the apertures (c) are respectively applied to the data (D) terminal, set (S) terminal and clock (CK) terminal of the D F/F 63. In response, the D F/F 63 produces the status decision signal (h). When the unique word detection pulse (d) is absent while the aperture (c) is open, the decision circuit 6 determines that no burst signals are present, i.e., only noise is present. As a result, the status decision signal (h) remains in a low level from the time when the aperture (c) is closed to the instant when the next slot timing signal (e) arrives. On the other hand, when the unique word detection pulse (d) appears while the aperture (c) is open, the decision circuit 6 determines that a burst signal is present and maintains the status decision signal (h) having gone high in response to the slot timing signal (e) in the high level.

Figure 5:
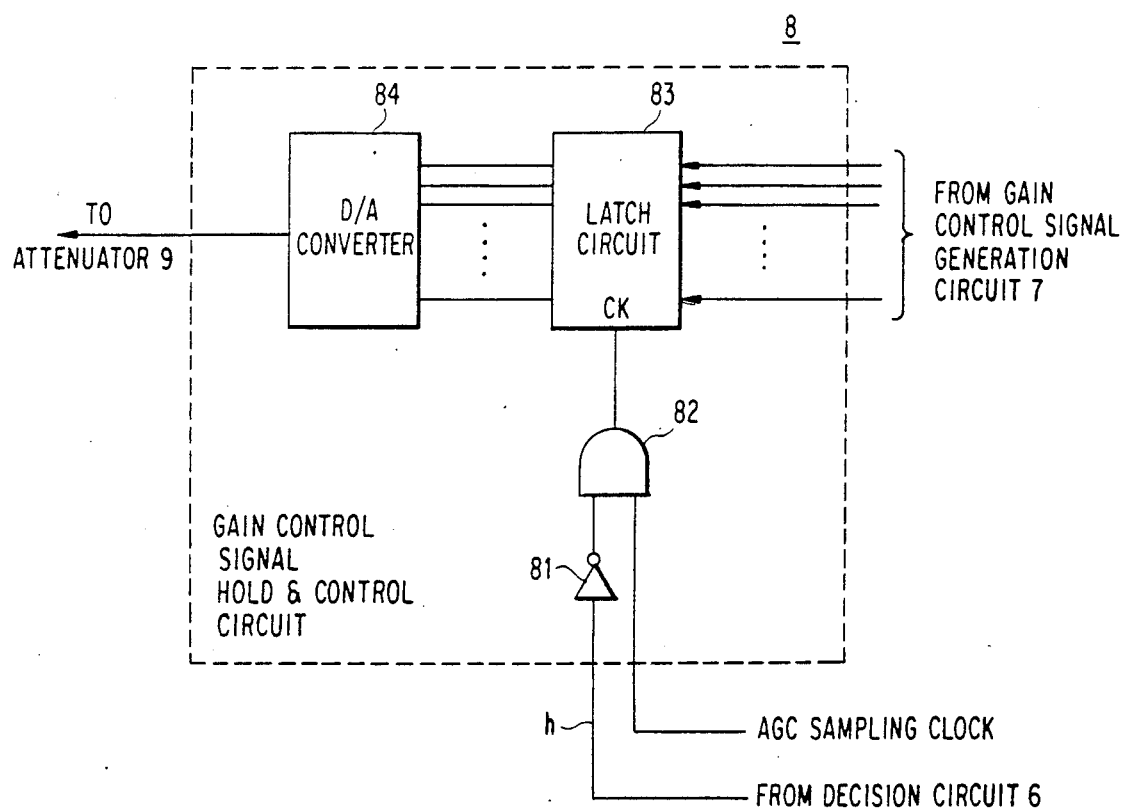
FIG. 5 is a block diagram schematically showing a gain control signal holding circuit.

Referring to FIG. 5, a specific construction of the gain control signal hold & control circuit 8 will be described. The hold & control circuit 8 has an inverting circuit 81, an AND gate 82, a latch circuit 83, and a digital-to-analog (D/A) converter 84. The inverting circuit 81 inverts the status decision signal (h) to produce an inverted signal. An AGC sampling clock for sampling the gain control signal of the AGC circuit 7 and the inverted signal of the status decision signal (h) are fed to the AND gate 82, the inverted signal serving as an enable signal. The latch circuit 83 latches the output of the n-bit AGC circuit 7 with latch pulses which is fed from the AND gate 82. In response, the latch circuit 83 produces an n-bit output signal. The D/A converter 84 converts the n-bit output of the latch circuit 83 into an analog signal to produce a control signal. While the status decision signal (h) having gone high in response to the slot timing signal is still in the high level, no latch pulse is fed to the latch circuit 83. As a result, the output of the AGC circuit 7 produced when the slot timing appeared is held, so that the output of the gain control signal holding circuit 8 is maintained constant. On the other hand, when the status decision signal (h) goes low, latch pulse are fed to the latch circuit 83 with the result that the hold & control circuit 8 delivers the output of the AGC circuit 7 directly without holding it. While the hold & control circuit 8 has been described on the assumption that the AGC circuit 7 is of a digital processing type, it is similarly practicable with an analog processing type AGC circuit if an A/D converter is connected to the input of the latch circuit 83.

Figure 6:
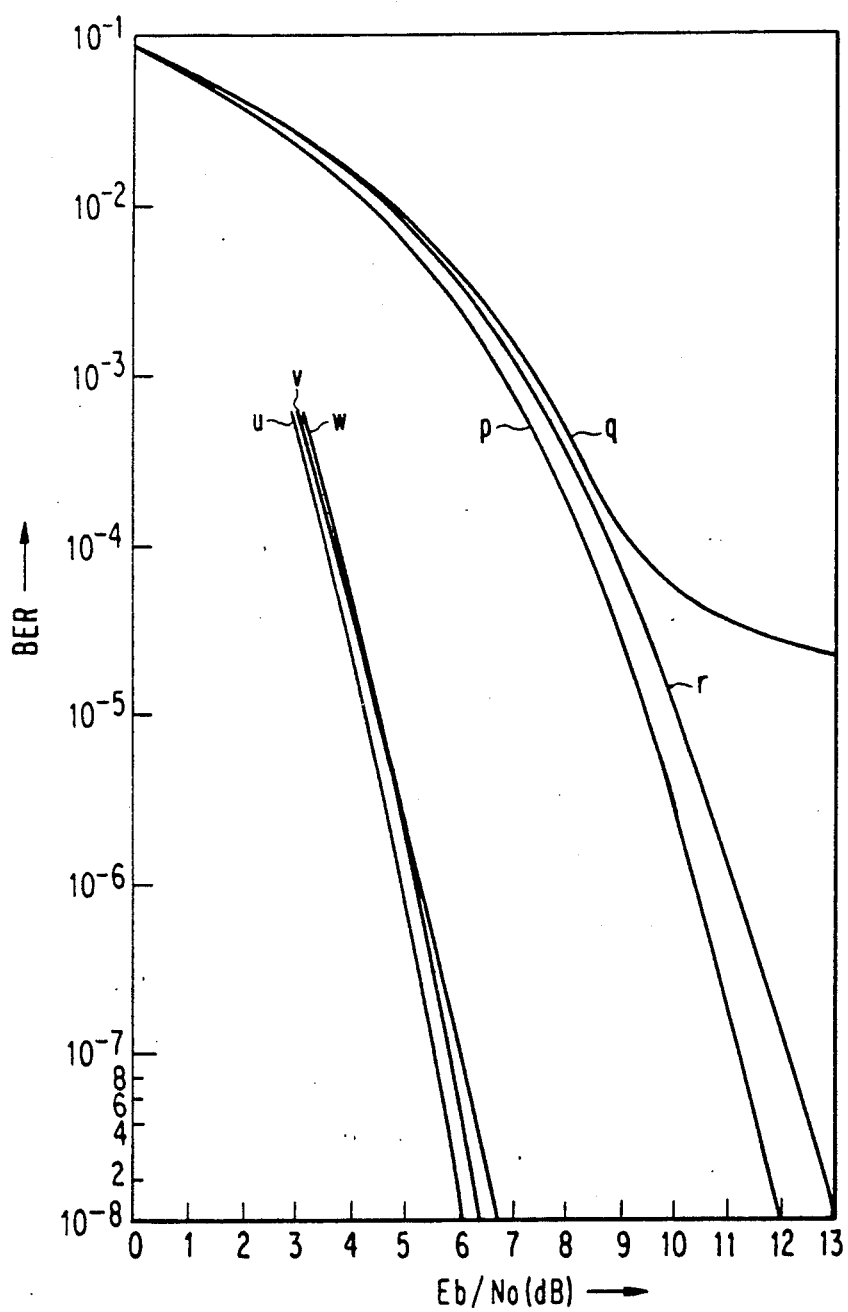
FIG. 6 is a graph showing a relationship between Eb/No and BER.

FIG. 6 is a graph showing a relation between Eb/No and BER particular to the coherent BPSK or QPSK modulation system. In the graph, P is representative of theoretical values determined without error correction coding and by using the following theoretical expression:

$$BER = \frac{1}{2} \, erfc(\sqrt{Eb/No})$$

where erfc is the err function and equal to $$erfc(x) = \frac{2}{\sqrt{\pi}} \int_x^\infty e^{-y^2} dy.$$

Eb/No is an energy-to-noise power density ratio per bit and corresponds to C/N.

In FIG. 6, q is representative of the values actually measured without error correction coding and by using the AGC of the present invention. By contrast, $\gamma$ is representative of the values actually measured with a conventional AGC and without error correction coding. Represented by u is the theoretical values derived from simulation with error correction coding. Further, v is representative of the values actually measured with the AGC of the present invention with error correction coding, while w is representative of the values actually measured with a conventional AGC with error correction coding. While various different approaches are available for error correction, the illustrative embodiment uses convolutional code as error correcting code in combination with VITERBI decoding. The constraint length k and the coding rate R are selected to be 7 and $\frac{1}{2}$, respectively. In FIG. 6, q is selected such that the linear region of the limiter 1 is reached when Eb/No is approximately 0 dB.

By comparing q and $\gamma$, it will be seen that BER associated with q degrades little in the relatively low Eb/No range despite the use of the limiter 1 and begins to degrade as Eb/No increases. Presumably, this is because in the low Eb/No range not only the linearity is low but also the influence of thermal noise is greater than that of non-linearity.

Nevertheless, BER corresponding to high Eb/No is acceptable since earth stations for satellite communication are so designed as to be operable even with BER corresponding to low Eb/No. In addition, high Eb/No is rarely attained for the actual channel reasons.

When a high BER characteristic is desired, use may be made of the error correcting system. It is to be noted that v, compared to w, degrades only slightly when Eb/No is high, and such a degree of degradation does not matter at all, as stated earlier.

When such an error correcting system is used, an error correcting decoder 10 may be connected to the output of the demodulator 2, in FIG. 1.

In summary, in an AGC device for a demodulator which receives burst signals time-serially from a plurality of stations, the present invention allows a limiter to be used by maintaining noise power constant at the input point of the limiter. Even when a plurality of burst signals has a substantial difference in power, i.e., when the levels of the burst signals fluctuate noticeably, the limiter promote stable demodulation without resorting to a longer preamble at the head of a burst signal.

What is claimed is:

1. An automatic gain control (AGC) for a demodulator which receives digitally modulated burst signals time-serially from a plurality of stations, comprising:

demodulating means for demodulating digitally modulated waves from the plurality of stations to produce a demodulated signal;

unique-word detecting means for detecting candidates of unique words out of said demodulated signal to output unique-word candidate detection pulses;

aperture generating means for generating apertures for detecting unique words;

gate means for detecting true unique words on the basis of said unique-word candidates detection pulses and said apertures to produce unique-word detection pulses;

deciding means for determining whether or not the burst signals exist on the basis of said unique-word detection pulses and said apertures to produce a status decision signal;

means for generating a gain control signal from a power value of said demodulated signal and a predetermined reference value;

control means responsive to said status decision signal for outputting said gain control signal as a control signal when the burst signals are absent and for outputting, when any burst signal is present, the gain control signal occurred at the time when a burst signal was absent immediately before said burst signal as the control signal, respectively;

variable attenuating means in response to said control signal for providing an amount of attenuation of input waves and outputting an attenuated signal; and limiter means for limiting said attenuated signal and for providing a limited signal which is applied as the modulated waves to said demodulating means.

2. An AGC as claimed in claim 1, wherein said deciding means determines whether or not any burst signal is present in terms of whether or not said unique-word detection pulse is detected while said aperture is open, thereby producing said status decision signal.

3. An AGC as claimed in claim 1, wherein said deciding means comprises:

an SR flip-flop having a set terminal to which said unique-word detection pulses are applied, and a reset terminal to which a slot timing signal in which the burst signals are arranged is applied.

means for producing a signal representative of an end of said aperture; and a D-type flip-flop having a data terminal to which an output signal of said SR flip-flop is applied, a set terminal to which said slot timing signal is applied, and a clock terminal to which said signal representative of the end of said aperture is applied, thereby producing said status decision signal.

4. An AGC as claimed in claim 1, wherein said control means comprises:

a latch means to which said gain control signal is applied;

means responsive to said status decision signal for generating a latch signal to be fed to a clock terminal of said latch means; and a digital-to-analog converter for converting an output signal of said latch means to an analog signal and outputting said analog signal as said control signal.

5. An AGC as claimed in claim 1, wherein said limiter means has an input and output characteristic which includes a linear range and a saturation range.

6. An AGC as claimed in claim 5, wherein said means for generating said gain control signal has a reference value which, in the worst Eb/no (energy-to-noise power density ratio per bit) condition on a channel, is determined as such noise power that the output of said limiter means lies in said linear range and in close proximity to the border between said linear and saturation ranges.

7. An AGC as claimed in claim 5, wherein said means for generating said gain control signal has a reference value which is such that noise power N at the input point of said limiter means satisfies:

$$N = A/(1 + (C/N)_{worst})$$

where $A = C + N$, $C$ is signal power, and $C/N$ is a signal power to noise power ratio in the worst Eb/No (energy-to-noise power density ratio per bit) condition on a channel.

8. An AGC as claimed in claim 1, further comprising error correcting means for correcting an error of said demodulated signal.

9. An AGC as claimed in claim 8, wherein said error correcting means comprises VITERBI decoding means.

* * * * *